Feb. 24, 1970 P. F. WALKER ET AL 3,497,058

PACKAGE FOR ELECTRONIC COMPONENTS

Filed Dec. 18, 1967

INVENTORS

PHILIP F. WALKER
HELMUT A. WEISSER
STANLEY T. STARZYK, JR.
ALONZO R. ELLSWORTH
JOSEPH A. BALINT

BY Richard C. Steinmetz Jr.
ATTORNEY

United States Patent Office 3,497,058

Patented Feb. 24, 1970

3,497,058

PACKAGE FOR ELECTRONIC COMPONENTS

Philip F. Walker, Wauwatosa, Alonzo Ray Ellsworth, Milwaukee, Stanley T. Starzyk, Jr., West Allis, Joseph A. Balint, Wauwatosa, and Helmut A. Weisser, Waukesha, Wis., assignors to Allen-Bradley Company, Milwaukee, Wis., a corporation of Wisconsin Filed Dec. 18, 1967, Ser. No. 691,403

Int. Cl. B65d *85/42, 43/12, 25/10*

U.S. Cl. 206—65 13 Claims

ABSTRACT OF THE DISCLOSURE

A package for electric components arranged in bulk, the package having a tubular shape. Support means are provided adjacent at least one open end of the tube to accommodate retaining means which can be removed in a sideways direction; while track means may be provided on opposite walls to locate end closing means in a desired position within the package.

This invention concerns a package for electronic components and more particularly a package for such components arranged in bulk as compared to the conventional spaced or individual arrangement.

The handling of electronic components, and particularly components having cylindrical body portions with leads extending therefrom, in a bulk arrangement has substantial advantages. However, to date, electronic component handling and packaging has been based upon non-bulk arrangement. Not only is there an economic advantage in handling resistors in a bulk arrangement due, for example, to the reduction in necessary component handling; but also the bulk arrangement permits more efficient packaging of electronic components since a smaller volume and therefore a smaller package is necessary for a comparable number of components. In addition it has been established that the bulk arrangement permits higher speed handling of the electronic components.

Of particular concern to any bulk package arrangement is the ever-present possibility that the electronic components will become disoriented. Such disorientation will reduce or restrict the advantages in bulk handling. This invention provides a package for bulk arrangement of electronic components which reduces the possibility of such disorientation to a minimum. In particular, a tubular package shape is used so as to conform to the desired bulk arrangement while adjustable end closing structure is used to assure an oriented condition of the electronic components while packaged.

Further, structure is provided for visual inspection of components arranged in bulk by means of slots.

Transferring the electronic components from a bulk package arrangement is also critical. The package structure of this invention aids such transfer by providing track means which provide for optimum positioning of the electronic components with respect to the walls of the package. Moreover, end closing means are provided so as to most efficiently locate the package with respect to any user's equipment before opening the package, i.e. retaining the desired control over the electronic components in the package in bulk arrangement until the package is finally located with respect to the user's equipment. At this point it is possible to withdraw the end closing means for the components in the packaged condition while not disrupting the oriented condition of the components.

These and other advantages of the package which constitutes the invention will become more apparent from the annexed drawings and the following detailed description.

It is to be understood that this detailed description is included for illustrative purposes only such that the scope of the invention is not so limited.

Figure 1:
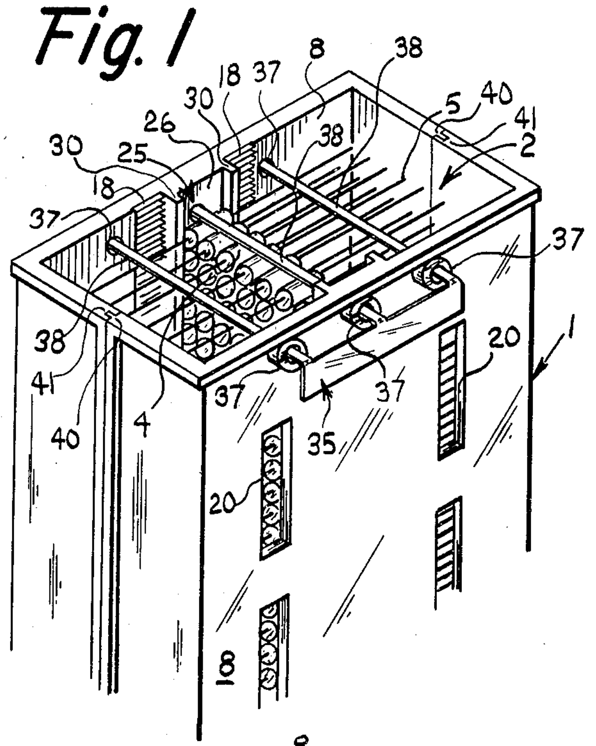
FIGURE 1 is a partial isomeric view of the electronic component package including one form of an end closing means.

The electronic component package 1 is shown in FIGURE 1 with a particular type of electronic component 2 located therein. Specifically, these electronic components 2 have cylindrical body portions 4 and leads 5 extending therefrom. An example of such components 2 is to be found in the form of electronic resistors.

The component package 1 is preferably rectangular as shown in FIGURE 1 and comprises two parallel walls 8 which are opposing walls. The electronic components 2 are preferably oriented with respect to these opposing walls 8 in a parallel fashion as shown in the FIGURE 1. The tubular configuration of the package is completed by the walls 9. Preferably, these walls 9 are regular and parallel so as to establish a rectangular or square cross-section for the component package 1.

Figure 3:
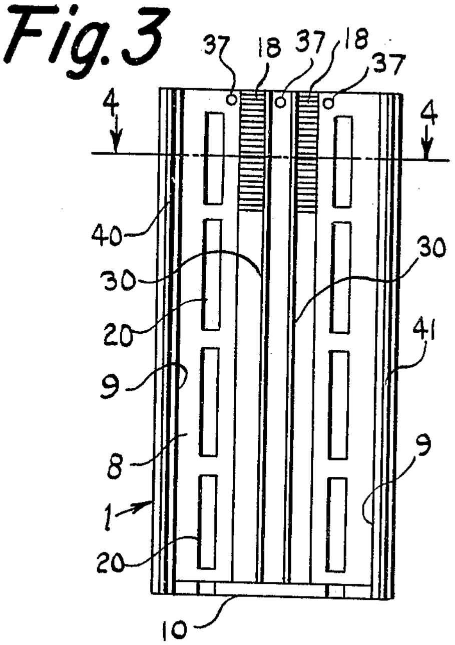
FIGURE 3 is a side view showing one-half of the package in FIGURE 1 as viewed from the inside.
Figure 2:
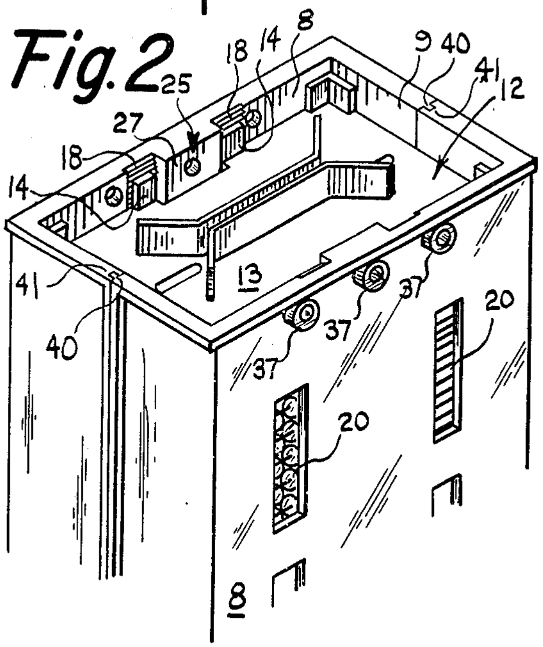
FIGURE 2 is a partial isometric view of the package as shown in FIGURE 1 but with a different end closing means.
Figure 4:
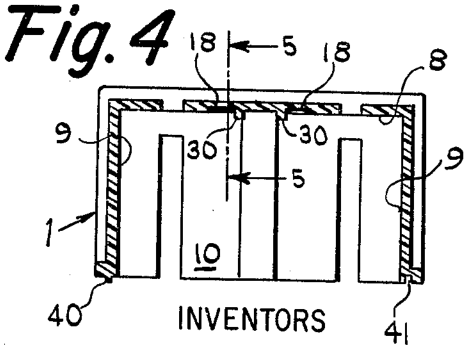
FIGURE 4 is a cross-sectional plan view taken along line 4—4 found in FIGURE 3.

It is particularly significant that the electronic components 2 be maintained in an oriented condition. The end closing means 12 shown in FIGURE 2 is adjustable so as to accomplish and maintain this necessary orientation. In particular, the end closing means 12 can be adjusted and retained in a desired position within the component package 1 and with respect to the electronic components 2 packaged therein so that these components 2 are respectively held. It is within the scope of this invention to have end closing means 12 at both open ends of the tube shaped component package 1 or at just one open end. The remaining end of the component package 1 may thereby be closed by other closing means including a permanent wall as shown in FIGURE 3 by end closing means 10.

End closing means 12 has an end wall surface 13 which is adjacent each of the walls 8 and 9 and which can be located in a desired position within the component package 1 so as to abut the electronic components 2 therein—thereby maintaining said components 2 in a desired, oriented bulk arrangement. The desired positioning of the end closing means 12 is preferably accomplished through serration means 18 in opposite walls, e.g. walls 8; which serration means 18 are located as a portion of or all of the length of each wall 8. The drawings also show a preferred arrangement for the serration means 18 utilizing parallel tracks in order to accommodate component package 1 which will be described below.

Contact between the end closing means 12 and the serration means 18 is accomplished through feet 14 which are attached to the end wall 13 and which have serration means compatible to and which will make contact with the serration means 18.

End wall 13 is made of a resilient material and handles 15 are attached thereto so as to permit flexing of the end wall 13. Thus, by pulling the handles 15 toward each other, the end wall 13 is flexed so as to disengage or partially disengage the serration means of the feet 14 from the serration means 18. Thereafter, the end closing means 12 can be moved to a new position within the component package 1.

Figure 5:
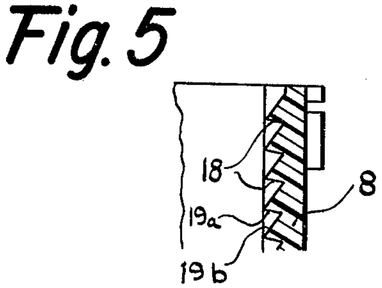
FIGURE 5 is a partial cross-sectional view taken along line 5—5 in FIGURE 4 so as to show the serrations used to retain end closing means.

Depending upon the material used for the component package 1, the end closing means 12 may or may not require the serration means 18. These serration means 18 have been found to be particularly valuable when plastic type materials are used for the package tube 1. As will be seen from the more detailed view of the serration means 18 at FIGURE 5, the serration means 18 are designed with a greater slope surface 19*a* and relatively lesser slope surface 19*b* (with respect to the wall 8)—the slope surface 19*a* facing away from the adjacent opening of the component package 1 so as to restrain outward motion of the end closing means 12. Obviously serration means of the feet 14 must be compatible with serration means 18.

It is many times necessary to know and establish the condition of the electronic components 2 within the component package 1. Again, as has been mentioned above, disorientation of these electronic components 2 is critical and the knowledge of this disorientation is extremely important. Therefore, visual inspection means have been provided in the component package 1 in the form of slots 20 which effectively run the length of the wall 8. Not only do these slots provide means for visual inspection but also, it is possible to use these slots to reorient those electronic components 2 which may become disoriented. It should be noted that this reorientation can take place at any point in the package.

As also mentioned above, disorientation of electronic components 2 is critical when the components 2 are transferred to or from the component package 1. In order to provide for the optimum handling conditions, track means 25 have been located in the opposing walls 8; or more generally, in those walls of the component package 1 which will abut the body portions 4 of the electronic components 2. These track means 25 have surfaces 26 and 27 shown in the FIGURES 1 and 2, respectively, which locate the body portion 4 of the abutting electronic component 2 at a preselected distance with respect to the wall 8. This distance with respect to wall 8 is selected so as to insure that the leads 5 do not contact the walls 8 of the component package 1. Experience indicates that it is contact between the leads 5 of the electronic components 2 and the walls 8 during movement of the component 2 with respect to the wall 8 which is most likely to cause the undesired disorientation of the components 2.

As can be seen from the FIGURES 1 and 2, the specific location of the surface, for example surfaces 26 and 27 of the track means 25, which will contact the body portion 4 of the electronic component 2 may vary; and in fact, this surface may be recessed into the wall 8. FIGURE 1 shows an additional feature for the track means 25, viz guide means 30 which may extend from the surface, such as surface 26, so as to further restrict the lateral motion of the body portions 4. Obviously, these guide means 30 may appear as the end, recessed walls of any recession in the wall 8 as mentioned above.

FIGURE 1 shows end closing means or retaining means 35 which are located in the component package 1 by support means 37—shown here as apertures in the walls 8. These support means 37 are specifically located so that the retaining means 35 can be removed by a sideways motion with respect to the end opening of the component package 1. While the particular retaining means 35 in the FIGURE 1 utilizes a fork construction with prongs 38, it is within the scope of this invention to use other end closing structure which will be removable by a sideways motion.

This retaining means 35 has particular application when transferring the electronic components 2 from the component package 1 to the user's handling equipment. Specifically, this end retaining means 35 permits the component package 1 to be inserted into the user's equipment while retaining the electronic components 2 in an oriented condition. Thereafter, the retaining means 35 can be removed by the sideways motion without disrupting the relative position between the package tube 1 and the user's handling equipment.

As will be seen from the FIGURES 1, 2 and 3, a particularly inexpensive and advantageous construction of the component package 1 is accomplished by molding the package in two halves. Thereafter, the halves are joined and bonded, for example by sonic welding, utilizing the tabs 40 which mate in the slots 41.

What is claimed is:

1. A package of cylindrical electronic components arranged in bulk having body portions and extending leads comprising:
   - (a) two parallel walls,
   - (b) a second set of walls joining said parallel walls to form a tube with at least one open end,
   - (c) said tube including support means located in opposing said walls at said open end to locate component retaining means in an end closing position for use with tube unloading,
   - (d) said support means permitting removal of said retaining means in a sideways direction with respect to said open end for ease in tube unloading, and
   - (e) said retaining means comprises fork like means with prong means which provide minimum contact with components in said bulk arrangement adjacent to said retaining means as one said prong means retains said body portions and two additional said prong means abut said leads on opposite sides of said body portions.
2. The package of claim 1 wherein end closing means are adjustably located in said tube and in a direction longitudinal to said parallel walls so as to establish a desired position in said tube with respect to any said components prior to tube unloading.
3. The package of claim 2 wherein a wall closes said open end opposite said at least one open end adjacent said support means.
4. The package of claim 1 wherein,
   - (a) at least two said opposite walls include first serration means adapted to retain an adjustable end closing means for said tube in a desired position with respect to any said components, and
   - (b) said end closing means has feet with second serration means which engage said first serration means for said desired positioning.
5. The package of claim 4 wherein said end closing means is flexible so as to be bent by handle means attached thereto and thereby permit sufficient disengagement between said first and second serration means to provide position adjustment of said end closing means.
6. A package of cylindrical electronic components arranged in bulk having body portions and extending leads comprising:
   - (a) two parallel walls,
   - (b) a second set of walls joining said parallel walls to form a tube with at least one open end,
   - (c) said second set of walls being spaced apart a distance substantially the same distance as the length of said components in said bulk arrangement,
   - (d) the internal side of said parallel walls including opposed track means located on a straight line extending the length of said walls from said open end and between said second set of walls in order to contact only the body portions of said components, and
   - (e) each said track means having a surface located with respect to a respective said wall so as to contact adjacent said body portions while preventing contact between said respective wall and the leads of each contacted body portion.
7. The package of claim 6 wherein,
   - (a) said tube includes support means adjacent at least one said open end to locate component retaining means in an end closing position,
   - (b) said support means permitting removal of said retaining means in a sideways direction with respect to said open end.

8. The package of claim 6 wherein end closing means are adjustably located in said tube so as to establish a desired position in said tube with respect to any said components.

9. The package of claim 8 wherein a wall closes said open end opposite said at least one open end adjacent said support means.

10. The package of claim 6 wherein,
(a) at least two said opposite walls include first serration means adapted to retain an adjustable end closing means for said tube in a desired position with respect to any said components, and
(b) said end closing means has feet with second serration means which engage said first serration means for said desired positioning.

11. A package of cylindrical electronic components arranged in bulk having body portions and extending leads comprising:
(a) two parallel walls,
(b) a second set of walls joining said parallel walls to form a tube with two open ends,
(c) said second set of walls being spaced apart a distance substantially the same distance as the length of said components in said bulk arrangement,
(d) said tube including support means located in opposing said walls at said open end to locate component retaining means in an end closing position for use with tube unloading,
(e) said support means permitting removal of said retaining means in a sideways direction with respect to said opening for ease in tube unloading, and
(f) closing means at the other said open end so as to establish a desired position in said tube with respect to any said components, said closing means adjustably located in said tube and in a direction longitudinal to said parallel walls.

12. The package of claim 11 wherein,
(a) at least two said opposite walls include first serration means adapted to retain an adjustable end closing means for said tube in a desired position with respect to any said components, and
(b) said end closing means has feet with second serration means which engage said first serration means for said desired positioning.

13. The package of claim 11 wherein slot means are located in said two parallel walls extending substantially the length thereof in order to observe and permit access to said bulk arrangement.

References Cited

UNITED STATES PATENTS

| | | | |
|---|---|---|---|
| 401,660 | 4/1889 | Scharnweber | 217—62 |
| 617,999 | 1/1899 | Archer | 217—62 |
| 732,919 | 7/1903 | Brown | 217—86 |
| 796,558 | 8/1905 | Bowman. | |
| 818,282 | 4/1906 | Dos Passos | 217—86 |
| 2,625,044 | 1/1953 | Christie | 220—93 X |
| 3,010,460 | 11/1961 | Lepreau | 220—93 X |
| 3,092,277 | 6/1963 | Brim. | |
| 3,393,797 | 7/1968 | Flood. | |

FOREIGN PATENTS

| | | | |
|---|---|---|---|
| 72,047 | 11/1944 | Norway. | |

MARTHA L. RICE, Primary Examiner

U.S. Cl. X.R.

206—45.16; 220—4, 41, 93